(12) United States Patent
Schwarzmann et al.

(10) Patent No.: US 7,892,859 B2
(45) Date of Patent: Feb. 22, 2011

(54) DEVICE AND METHOD FOR SWITCHING ELECTRIC SIGNALS AND POWERS

(75) Inventors: Holger Schwarzmann, Hoechstadt (DE); Sven Berberich, Spardorf (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 189 days.

(21) Appl. No.: 12/370,291

(22) Filed: Feb. 12, 2009

(65) Prior Publication Data

US 2009/0230441 A1 Sep. 17, 2009

(30) Foreign Application Priority Data

Feb. 13, 2008 (DE) .................... 10 2008 008 931

(51) Int. Cl.
*H01L 21/00* (2006.01)
*H01L 29/76* (2006.01)
(52) U.S. Cl. .......................... 438/3; 257/295
(58) Field of Classification Search ............... 438/3, 438/29, 48; 257/295, E43.001–E43.007
See application file for complete search history.

(56) References Cited

U.S. PATENT DOCUMENTS

| 3,215,568 | A | | 11/1965 | Pfann |
| 3,365,553 | A | | 1/1968 | Touchy et al. |
| 3,585,415 | A | * | 6/1971 | Muller et al. ............... 310/319 |
| 6,767,749 | B2 | * | 7/2004 | Kub et al. ...................... 438/3 |
| 7,586,158 | B2 | * | 9/2009 | Hierlemann et al. ........ 257/369 |
| 2007/0018328 | A1 | | 1/2007 | Hierlemann et al. |

FOREIGN PATENT DOCUMENTS

| DE | 1251552 | 10/1967 |
| GB | 1105206 | 3/1968 |
| KR | 10-0148420 | 10/1998 |

* cited by examiner

*Primary Examiner*—Calvin Lee
(74) *Attorney, Agent, or Firm*—Michael A. Glenn; Glenn Patent Group

(57) ABSTRACT

A device for switching an electric signal having a first member having a p-doped area with a first terminal and an n-doped area with a second terminal and a second member coupled to the first member to cause a mechanical deformation of the first member in an area of a transition from the p-doped area into the n-doped area.

21 Claims, 13 Drawing Sheets top view

A)

B) view: level AB

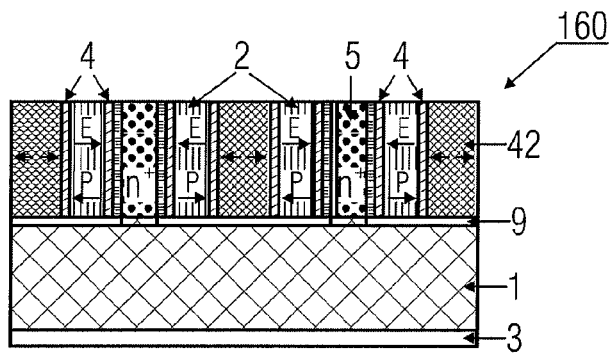
FIGURE 16
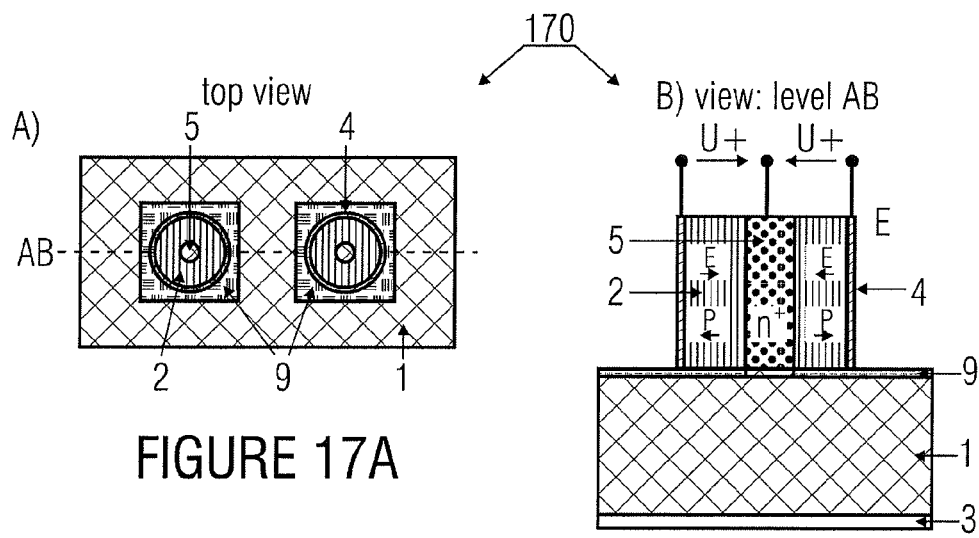
FIGURE 17A
FIGURE 17B
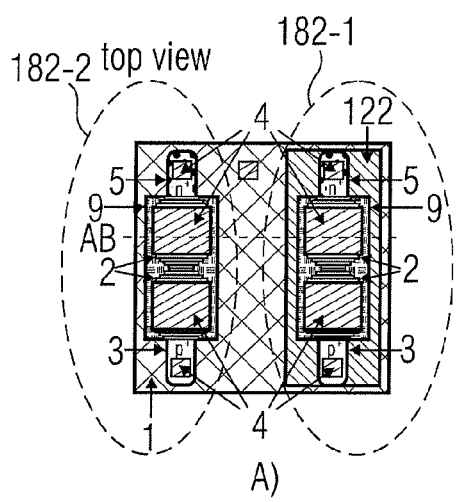
FIGURE 18A     FIGURE 18B

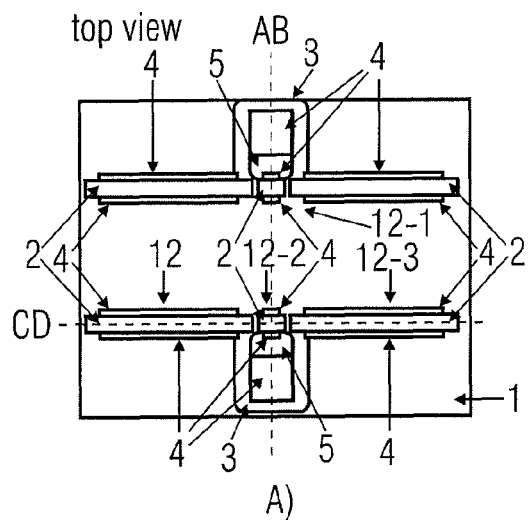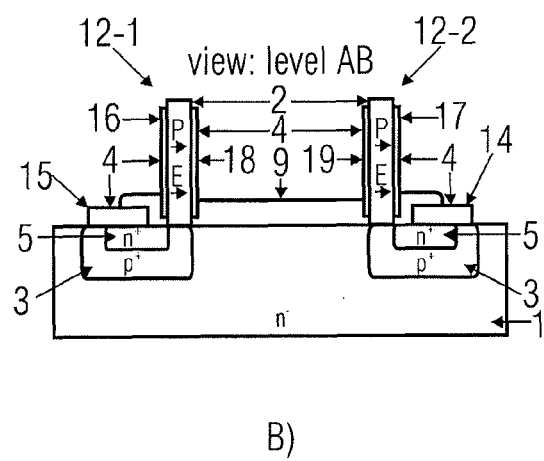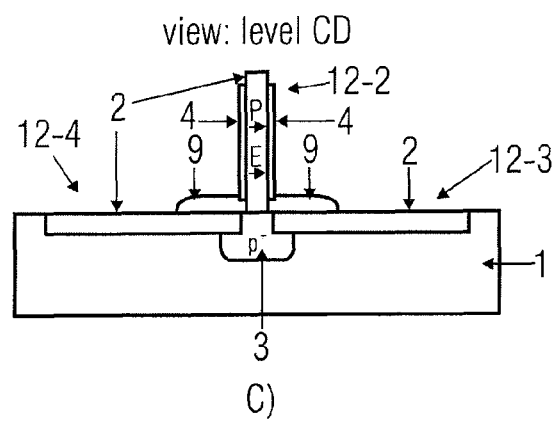
FIGURE 21A
FIGURE 21B
FIGURE 21C

DEVICE AND METHOD FOR SWITCHING ELECTRIC SIGNALS AND POWERS

CROSS-REFERENCE TO RELATED APPLICATIONS

This application claims priority from German Patent Application No. 10 2008 008 931.1-33, which was filed on Feb. 13, 2008, and is incorporated herein in its entirety by reference.

BACKGROUND OF THE INVENTION

The present invention generally relates to devices and methods for switching electric signals, as they may be used, for example, in integrated circuits.

In integrated and discretely set-up circuits of digital technology and power electronics, mainly transistors based on metal-oxide semiconductor field-effect transistor (MOSFET) or metal-insulator semiconductor field-effect transistor (MISFET) technology are used as electric switching devices, as they show a comparatively low drive overhead. Complementary designs, n or, respectively, p channel transistors of a normally off (enhancement transistor type) or normally on (depletion transistor) transistor type are used.

Transistors which are based on MOS or MIS technology, respectively, represent the main portion of electric semiconductor switching devices. The MOS or MIS technology, respectively, is continually being improved in the field of applied materials. For example, a silicon substrate may be used with an epitaxially grown silicon-germanium layer, whereby conductivity in the area of the inversion channel is increased due to the higher mobility of the charge carriers. Depending on the application, metals, polysilicon or silicates are used as electrode materials for the gate, source or drain contacts, respectively. In the course of constant miniaturization of the dimensions of the MOS structures, also for the gate dielectric instead of $SiO_2$ alternative layer materials are used, e.g. high-epsilon layers like hafnium dioxide or aluminum dioxide.

Further improvements of the MOS or MIS technology, respectively, refer to geometric aspects of the MOS structure. For example, for this purpose the process of lightly doped drain (LDD) contact may be used for preventing electric field peaks close to the drain area or the FinFET technology for an improved implementation of an inversion channel (keyword: "double gate").

A further improvement of the MOS or MIS technology, respectively, with regard to the increase of the charge carrier mobility may be achieved by a strained silicon. Strained silicon consists of a silicon-germanium layer (SiGe) onto which a thin silicon layer is applied. Due to the fact that the SiGe layer has a crystal structure with a higher lattice constant, i.e. with greater distances between the individual atoms, at the contact location of the SiGe and the Si layers, the crystal lattice of the silicon is somewhat expanded, so that also the distances between the Si atoms become larger. Due to the greater distances between the atoms, the electric conductivity or the charge carrier mobility is increased, respectively. This in turn leads to a faster transit of the electrons through the silicon layer and thus allows a faster switching speed of a transistor and thus also a faster clocking of a processor. By the respective change or deformation of the crystal lattice in the area of the channel area, i.e. by a targeted introduction of germanium atoms into the silicon substrate and/or by depositing a pressure- or tension-generating nitride compound above the gate contact thus the effective mass or, respectively, the mobility of the charge carriers in the inversion channel of a transistor may be affected. These changes or deformations of the crystal lattice structure, respectively, as are caused by the "strained silicon" technology, are unique and permanent interventions into a semiconductor crystal.

In principle, the function of an MOS structure is still applied for switch control or drive, i.e. an electric field (across the applied gate voltage) is further necessitated to generate an inversion channel at the boundary surface (interface) of the substrate and the gate dielectric.

Basic requirements with regard to an electric switching device are a low series resistance in the ON (conducting) operation and a low leakage current in the OFF (non-conducting) operation. Additionally, in many cases of application, e.g. in digital data processing or high-frequency technology, fast switching cycles between the ON and OFF state of the electric switch are necessitated. MOS-controlled switches may be adapted to the requirement profile via design parameters like geometric dimension, doping, etc., generally, however, a trade-off between the on or off characteristics of the transistor, respectively, has to be found, e.g. the DMOS transistor (double diffused MOS).

A further disadvantage of MOSFET or MISFET technology, respectively, is that only one charge carrier type (the majority charge carrier) contributes to the current flow. This limitation is not given with bipolar transistors. Here, both the majority and also the minority charge carriers contribute to the current flow. This leads to especially high current densities in the case of passage. Bipolar transistors, however, generally necessitate a costly control and have a relatively high leakage current in the OFF state. Thus, they are not suitable for many applications, in particular with regard to current-saving electronics, e.g. in mobile devices.

SUMMARY

According to an embodiment, a device for switching an electric signal may have a first member having a p-doped area with a first terminal and having an n-doped area with a second terminal, and a second member coupled to the first member having a piezoelectric area and a terminal for a control signal, to cause, by applying the control signal to the piezoelectric area, a mechanical deformation of the first member in an area of a transition from the p-doped area into the n-doped area, wherein the piezoelectric area is mechanically biased by coupling an arrangement generating pressure or tension onto the piezoelectric area to the piezoelectric area.

According to another embodiment, a method for switching an electric signal may have the steps of coupling a first member having a p-doped area with a first terminal and an n-doped area with a second terminal to a second member with a piezoelectric area and with a terminal for a control signal; coupling an arrangement generating pressure or tension on the piezoelectric area to the piezoelectric area to mechanically bias the piezoelectric area; applying the control signal to the piezoelectric area to cause a mechanical deformation of the first member by the second member in an area of a transition from the p-doped area into the n-doped area.

It is the finding of the present invention that, by a mechanical deformation of an area of a pn transition, an effective mass of charge carriers of an underlying semiconductor material and thus also the mobility of the charge carriers and the band structure of the semiconductor material may be changed. By a mechanical deformation of a crystal lattice of the semiconductor material, e.g. silicon or germanium, in the direction of pressure or tension, the pn transition may thus be brought from an electrically on into an off state or vice versa, similar to a switching transistor.

A device for switching an electric signal and/or an electric power includes, according to embodiments of the present invention, a first member comprising a p-doped area with a first terminal and an n-doped area with a second terminal, wherein the first and the second terminal of the first member serve for applying the electric signal to the first member. Further, an inventive device for switching includes a second member coupled to the first member to cause a mechanical deformation of the first member in the area of a transition from the p-doped area to the n-doped area.

The transition from the p-doped area to the n-doped area is in the following referred to as a pn transition.

According to one embodiment of the present invention, the second member is implemented to cause the mechanical deformation of the pn transition of the first member such that a mobility of electric charge carriers in the first member changes, so that the first member may be set into an electrically on or off state. For this purpose, the second member may, according to embodiments, include a piezoelectric area with a terminal for a control signal to cause an indirect piezoelectric effect by applying the control signal to the piezoelectric area and to cause by this the mechanical deformation of the pn transition of the second member.

The first and the second terminal of the first member may be wired up such that the pn transition of the first member is normally off. In the same way, both terminals may be wired up so that the pn transition of the first member is normally on.

According to embodiments, the first member and the second member may be set up or arranged as discrete members, respectively. In embodiments, the device for switching is set up as a monolithically integrated switch, however, i.e. the first and the second members are integrated on a common semiconductor substrate.

Advantageous continuations of the invention result from the dependent claims.

Embodiments of the present invention thus both relate to monolithically integrable and also discretely realizable switching devices. The functional principle of these switching devices is based on the utilization of characteristics of a pn transition in connection with the indirect piezoelectric effect. An inventive switching device, also referred to as "piezo-pn switch" does not depend on a direct influence of electric fields for implementing an on or off inversion channel, respectively. By embodiments of the present invention, a simple control of bipolar semiconductor structures and high current densities may be achieved.

A further advantage of the present invention is the possibility of controlling the control terminal of a piezo-pn switch in a completely dielectrically insulated way. This enables a further degree of freedom with the use of an inventive piezo-pn switch, as it is decoupled from the anode and cathode potential of the switch.

BRIEF DESCRIPTION OF THE DRAWINGS

In the following, embodiments of the present invention are explained in more detail with reference to the accompanying drawings, in which:

FIG. 16 shows a sectional view of a vertically set-up piezo-pn switch having an insulated, radial piezo actuator and a mechanical bias according to an embodiment of the present invention;

FIGS. 17a,b show a top view and a sectional view of a vertical piezo-pn switch having a non-insulated, radial piezo actuator according to an embodiment of the present invention;

FIGS. 18a,b show a top view and a sectional view of a lateral piezo-pn switch having an insulated, radial piezo actuator according to an embodiment of the present invention;

FIGS. 21a-c show different views of a bidirectional switch according to an embodiment of the present invention.

DETAILED DESCRIPTION OF THE INVENTION

Figure 1A:
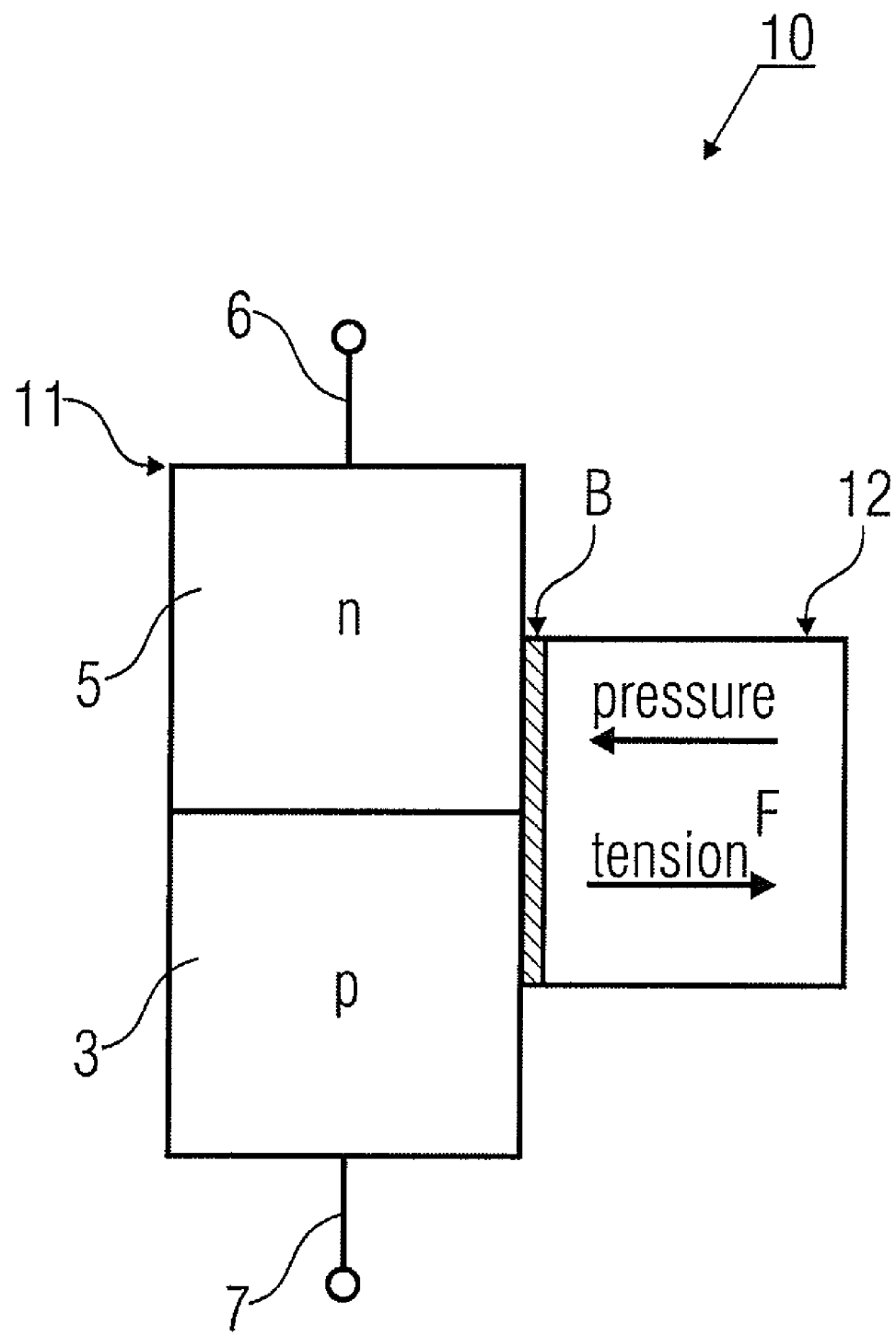
FIG. 1a shows a schematical top view of a device for switching an electric signal according to an embodiment of the present invention.

With regard to the following description it should be noted that in the different embodiments like or seemingly like functional elements comprise the same reference numerals and that thus the descriptions of those functional elements in the different embodiments described in the following may be interchanged.

FIG. 1a shows a schematical view of a switch 10 or, respectively, a device for switching an electric signal according to an embodiment of the present invention.

According to embodiments, the switch 10 includes a first member 11 comprising a p-doped area 3 having a first terminal 7 and an n-doped area 5 having a second terminal 6 for applying the electric signal to the first member 11. Further, the switch 10 includes a second member 12 coupled to the first member 11 via a coupling area B to cause a mechanical deformation of the first member 11 in an area of a transition from the p-doped area 3 to the n-doped area 5.

According to embodiments of the present invention, the second member 12 is implemented to cause the mechanical deformation of the first member 11 such that an effective mass of electric charge carriers in the first member 11 is changed, so that the first member 11 or its pn transition, respectively, may be set into an electrically on or off state by the mechanical deformation.

The second member 12 may thus, for example, exert a compressive and/or tensile force on the first member 11, in particular its pn transition. The second member 12 is thus an actor or actuator which converts (electric) signals into mechanical work, i.e. motion. This may, for example, be an electromechanical actuator or a piezo actuator. In this regard, in embodiments the second member 12 includes a piezoelectric area with a terminal for a control signal to cause the mechanical deformation by the indirect piezoelectric effect by applying the control signal to the piezoelectric area.

According to one embodiment, the switch 10 is set up discretely, i.e. the first and the second members 11, 12 are discrete members. According to embodiments, the switch 10 is a monolithically integrated switch member, i.e. the first member 11 and the second member 12 are integrated on a common semiconductor substrate. Such an integrated switch member 20 according to one embodiment of the present invention is schematically illustrated in the top view of FIG. 1b.

The switch 20 includes a first member 11 on a semiconductor substrate 1 comprising a p-doped area 3 having a first terminal 7 and an n-doped area 5 having a second terminal 6. Further, the switch 20 includes a second member 12 on the semiconductor substrate 1 which is coupled to the first member 11 to cause a mechanical deformation of the first member 11 in an area of the pn transition. For this purpose, the second member 12 comprises a piezoelectric area 2 having a terminal 8 for a control signal in order to cause the mechanical deformation of the pn transition by the indirect piezoelectric effect by applying the control signal to the piezoelectric area 2. The terminals 6, 7 for the electric signal to be switched and 8 for the control signal each comprise an electrically conductive material 4, like, e.g., metal, polysilicon or silicate.

The piezoelectric area 2 of the second member 12 may, according to embodiments, be set up from one or a plurality of piezoelectric material layers. Possible piezoelectric materials are, for example, lead zircon titanate, silicon carbide, aluminum nitride, zinc oxide, potassium niobate or piezoelectric ceramics.

According to embodiments, the substrate 1 may comprise a direct semiconductor or a doped direct semiconductor. Direct semiconductors are, for example gallium arsenide, gallium phosphide or indium antimonide. According to further embodiments, the substrate 1 may comprise an indirect semiconductor or a doped indirect semiconductor. Indirect semiconductors are, for example, silicon, silicon carbide or germanium.

The complementarily doped areas 3, 5 of the pn transition of the first member 11 comprise, according to embodiments, a complementarily doped direct semiconductor.

Figure 1B:
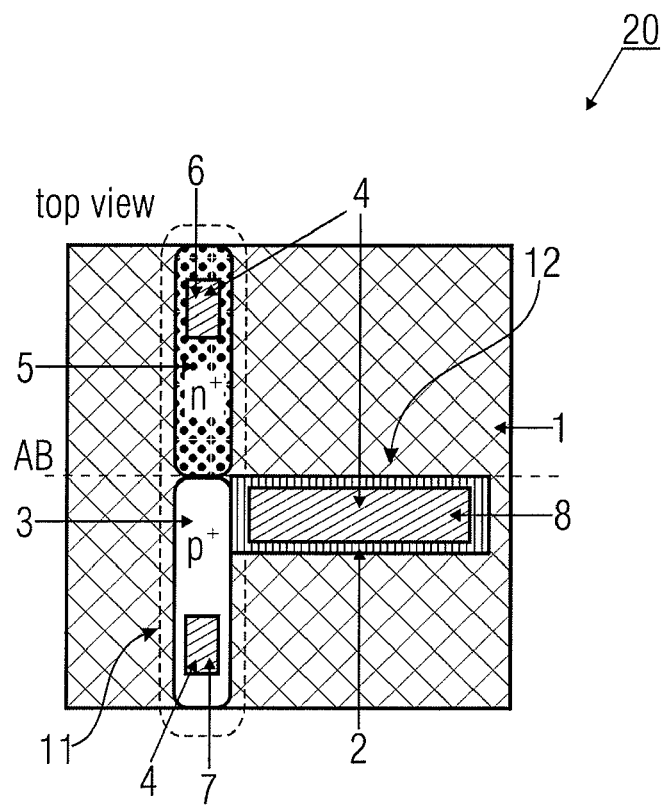
FIG. 1b shows a schematical top view of a monolithically integrated device for switching an electric signal according to an embodiment of the present invention.
Figure 1C:
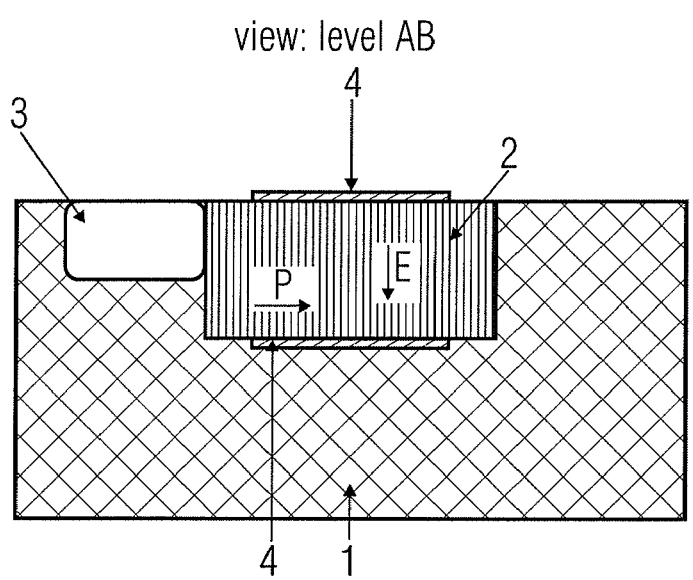
FIG. 1c shows a schematical sectional view of the inventive device illustrated in FIG. 1b.

FIG. 1c shows a sectional view through a plane AB of the integrated switch 20 illustrated in FIG. 1b.

According to embodiments, the control terminal 8 for the control signal is formed by two contacts or, respectively, electrodes 4 of an electrically conductive material arranged at opposing sides of the piezoelectric area 2.

In some embodiments of the present invention, in particular when the device for switching is implemented as an integrated switch, all electrodes 4 of the terminals 6, 7 and 8 may lie on a surface of the switch, so that an especially easy electronic contacting is only possible from one side. In further embodiments, electrodes 4 of the terminals 4, 6, 7 may, of course, also be arranged on opposing sides of the switch 10, so that an electrical contacting may be executed from opposing sides of the switch.

A transition from an on into an off state of a piezo-pn switch 10, 20 is accomplished via a mechanical deformation of the crystal lattice of a semiconductor material of the first member 11 in the direction of pressure or tension. By the mechanical deformation of the crystal lattice, the effective mass of the charge carriers of the semiconductor may be changed and thus also the mobility of the charge carriers and the band structure of the semiconductor. The effective mass here designates an apparent mass of a particle in a crystal within the scope of a semi-classical specification of quantum physics. It may be seen that in many situations electrons and holes in a crystal react similarly to electric and magnetic fields, as if they were free particles in a vacuum, only having a changed mass. This effective mass is usually given in units of electron mass.

The mechanical deformation of the semiconductor crystal of the first member 11 is effected via the use of the indirect piezoelectric effect or the so-called electrostriction, respectively. Electrostriction describes the deformation of a dielectric medium depending on an applied electric field. Here, the second member 12 with its piezoelectric area 2 behaves as a piezoelectric actuator when applying the control signal, e.g. in the form of a control voltage, to the control terminal 8. For the deformation of the pn transition of the first member 11, the second member 12 may include piezoelectric longitudinal, transversal, radial and/or shear actuators.

Parts of the n-doped area 5 and/or the p-doped area 3 of the first member 11 are flanked by the piezoelectric area 2 of the second member 12. In the case of the embodiment illustrated in FIG. 1b, the flanked area is exemplarily selected to be p-doped. The piezoelectric area 2, e.g. PZT, SiC, ZnO, AlN, KnbO$_3$, is contacted with an electrically conductive material 4, e.g. metal or highly doped polysilicon, on opposing sides, in FIG. 1b the top and bottom side of the piezoelectric area 2. By contacting the n-doped area 5 and the p-doped area 3 by an electrically conductive material 4 each, the electrodes 6, 7 are formed, wherein in the example shown in FIGS. 1b, c, the electrode 6 acts as an anode and the electrode 7 as a cathode.

The control terminal 8, which acts as a kind of gate electrode, is realized by a contacting of the piezoelectric area 2.

For the wiring illustrated in FIGS. 1*b*, *c*, the anode 6 contacts the n-doped area 5, the cathode 7 contacts the p-doped area 3, the piezo-pn switch 20 is normally off. For this purpose, FIG. 2*a* shows possible voltage-current characteristic curves (U-I characteristic curves).

Figure 2A:
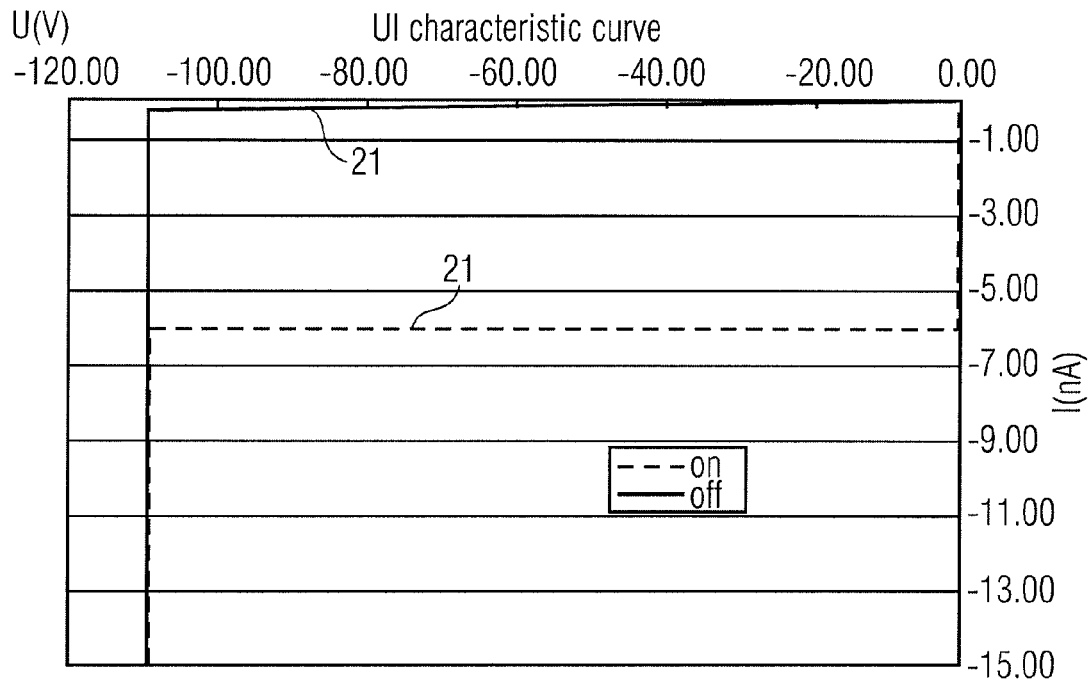
FIG. 2a shows simulated, possible U-I characteristic curves of a normally off switch according to an embodiment of the present invention.

For a normally off piezo-pn switch according to embodiments of the present invention, FIG. 2*a* shows in the 3rd quadrant a possible course 21 of the characteristic curve for an ON state of the switch or a course 22 of the characteristic curve for an OFF state of the switch, respectively. In the OFF state, i.e. at the control terminal 8 of the second member 12 no electric control voltage is applied, a reverse current flows which may be set via the doping of the n-doped area 5 and/or the p-doped area 3. In order to change into the ON state of the switch, the second member 12 or its piezoelectric area 2, respectively, deforms the crystal lattice of the pn transition of the first member 11 such that the effective mass of the charge carriers located therein is increased. The ON state may be achieved by applying an electric current to the control terminal 8 of the second member 12. By the increase of the effective mass of the charge carriers, the intrinsic charge carrier concentration is increased and thus also the current density in the area of the mechanically deformed p-doped area 3. Thus, the magnitude of the reverse current in the ON state (at the control or gate electrode 8, respectively, an electric control voltage is applied) is higher than in the OFF state, as the course of the curves 21 and 22 shows.

Figure 2B:
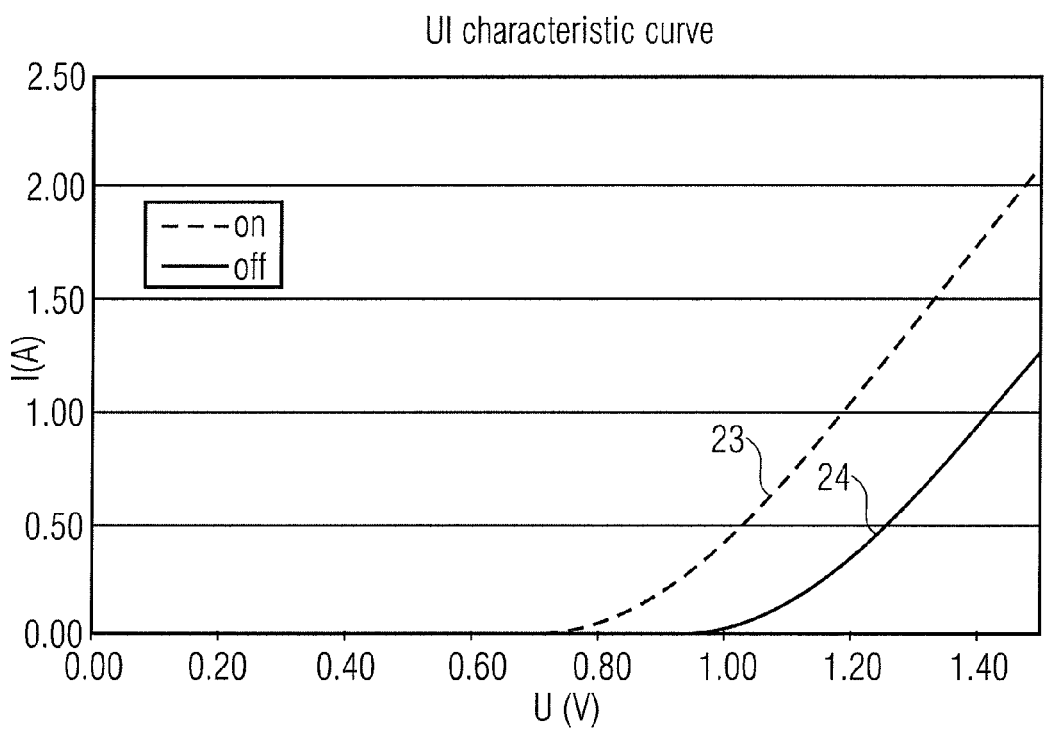
FIG. 2b shows simulated, possible U-I characteristic curves of a normally on switch according to embodiments of the present invention.

According to embodiments, a piezo-pn switch may also be implemented as a normally on switch. For this purpose, the anode 6 and cathode 7 are exchanged, i.e. the anode goes from the n-doped area 5 into the p-doped area 3 and the cathode 7 goes from the p-doped area 3 into the n-doped area 5. The corresponding voltage-current characteristic curves of the $1^{st}$ quadrant are illustrated in FIG. 2*b*.

With a non-deformed crystal lattice, i.e. no control voltage applied to the control terminal 8 (curve 24), the ON state current of the pn transition is smaller than in the ON state of the switch (curve 23). The OFF state is achieved by decreasing the effective mass of the charge carriers. This is done by applying an electric control voltage to the control electrode 8, which causes the deformation of the crystal lattice of the semiconductor material of the first member 11 via the piezo actuator 12.

Figures 3A, 3B:
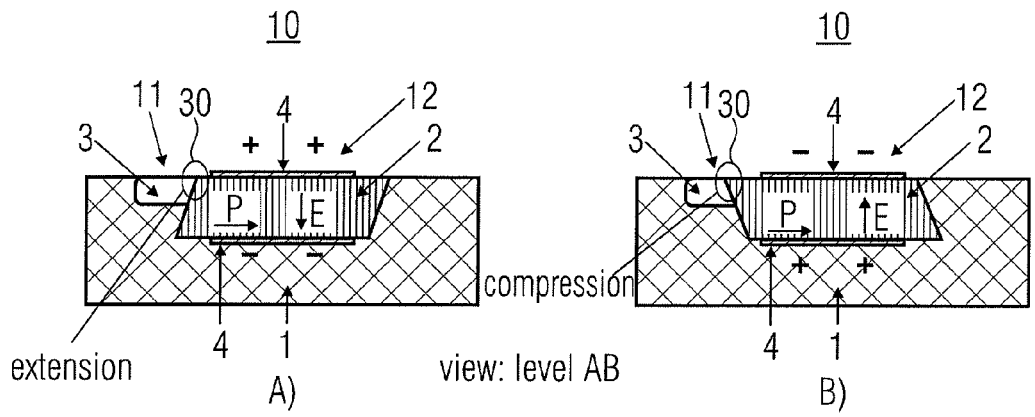
FIGS. 3a,b show operation modes of a piezo-pn switch having a one-sided piezoelectric shear actuator according to an embodiment of the present invention.

By a combination of geometric dimensions, electrode arrangements and a direction of a polarization axis of the piezoelectric area 2, different modes of the indirect piezoelectric effect may be realized. FIGS. 3*a, b* show a sectional view of the sectional plane AB indicated in FIG. 1A in a possible implementation of a piezo-pn switch using a piezoelectric shear actuator ($d_{15}$ effect).

By applying a control voltage to electrically conductive contacts 4 (forming the control terminal 8) arranged at opposing sides of the piezoelectric area 2, between the two opposing electrically conductive contacts 4, an electric field E is formed. A direction of a polarization P of the piezoelectric area 2 between the two electrodes 4 is in a plane perpendicular to the direction of the electric field E. I.e. the direction of the electric field E forms an angle of 90°±20° with the polarization direction P of the piezoelectric area 2. By applying the control voltage to the electrically conductive contacts 4, the piezoelectric material shears out as a consequence of the indirect piezoelectric effect ($d_{15}$ effect). The coupling area B of the p-doped area 3 of the first member 11 and the piezoelectric area 2 of the second member 12 is stretched or compressed depending on the polarity of the control voltage applied to the electrically conductive contacts 4, as it is illustrated in FIGS. 3*a* and *b*.

Figures 4A, 4B:
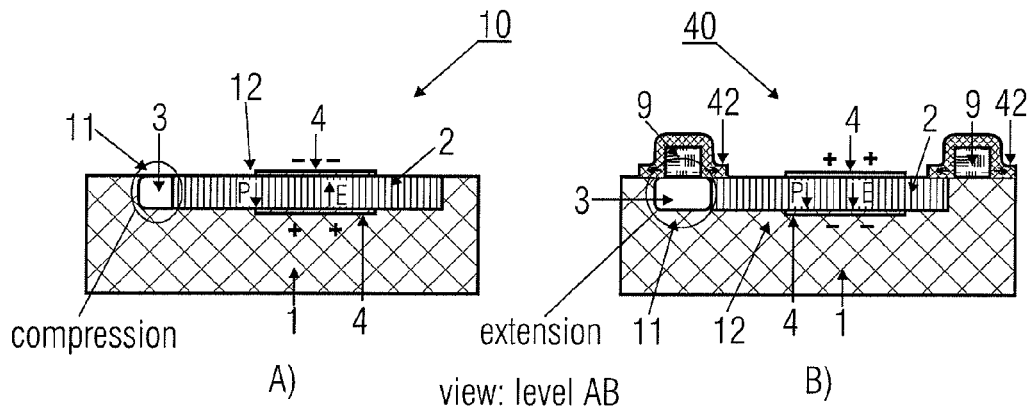
FIGS. 4a,b show operation modes of a piezo-pn switch having a one-sided transversal piezo actuator according to embodiments of the present invention.

FIGS. 4*a, b* show modes of operation of an inventive piezo-pn switch using a transversal piezo actuator ($d_{31}$ effect), wherein a change of length perpendicular to an electric field takes place. Here, the direction of the polarization P of a stripped piezoelectric area 2 is parallel or, respectively, antiparallel to the direction of the electric field caused by the control voltage applied to the electrically conductive contacts 4. In the embodiment illustrated in FIGS. 4*a, b*, by applying the control voltage between the electrically conductive contacts 4, an electric field E is formed having a field direction forming an angle of 0°±20° or 180°±20°, respectively, with the polarization direction P of the piezoelectric area 2, so that, when applying the control voltage to the piezoelectric area 2, the pn transition is extended or compressed depending on the polarization of the control voltage by a mechanical influence of the piezoelectric area 2. By applying the control voltage, the piezoelectric area 2 is extended or compresses relative to its length.

For an improved tensile behavior of the piezoelectric area 3 or the piezoelectric actuators, respectively, the same may be mechanically biased. For this purpose, FIG. 4*b* shows an illustration of a possibility for causing a mechanical biasing both of the crystal lattice of the semiconductor material of the first member 11 and of the piezoelectric area 2 of the second member 12.

Instead of a one-time deformation of the crystal lattice, a tensile nitride 42 applied over an insulator 9, for example $SiO_2$, serves for a mechanical biasing of the second member or the piezoelectric actuator 12, respectively. In embodiments of the present invention, the piezoelectric area 2 of the piezoelectric actuator 12 is mechanically biased by arranging a biasing arrangement 9, 42 generating pressure or tension onto the piezoelectric area 2, wherein the biasing arrangement 9, 42 comprises a nitride compound. Here, the biasing arrangement 9, 42 may be coupled to the first and/or the second member 11, 12 such that, apart from the mechanical biasing of the second member 12, it also causes a mechanical biasing with regard to an area of the pn transition of the first member 11, as it is illustrated in FIG. 4*b*.

Figures 5A, 5B:
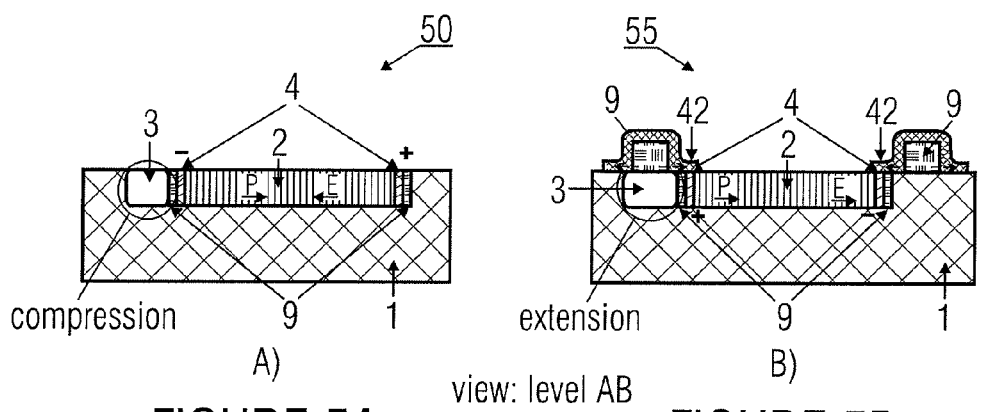
FIGS. 5a,b show operation modes of a piezo-pn switch having a one-sided longitudinal piezo actuator according to embodiments of the present invention.

A further mode of operation of an inventive piezo-pn switch is illustrated as an example using a longitudinal piezo actuator ($d_{33}$ effect), wherein a change of length of the piezoelectric material takes place in the direction of the electric field in FIGS. 5*a, b*.

Here, the opposing electrically conductive contacts 4 are not arranged in planes in parallel to the surface of the piezo-pn switch 50, as it was the case with the previously described piezo-pn switches, but in planes perpendicular to the switch surface. The direction of polarization P of the bar-shaped piezoelectric area 2 is parallel or anti-parallel, respectively, i.e. in an angle between 0°±20° or 180°±20°, respectively, to the direction of the electric field E, which is caused by applying the control voltage to the electrically conductive contacts 4. The electrically conductive contacts 4 lying on a cover or, respectively, floor area of the bar-shaped piezoelectric area 2 are separated from the pn structure of the first member 11 by an insulation layer 9. As with the above-presented piezo-pn switches, the piezoelectric material of the piezoelectric area 2 may be stretched or compressed by the control voltage. According to embodiments of the present invention, for biasing the longitudinal piezo actuator, again a biasing arrangement 9, 42 with a nitride 42 may be applied at the ends of the piezoelectric area 2 over an insulator 9 using a tensile or compressive force, as it is illustrated schematically in FIG. 5*b* and has already been described with reference to FIG. 4*b*.

Figure 6:
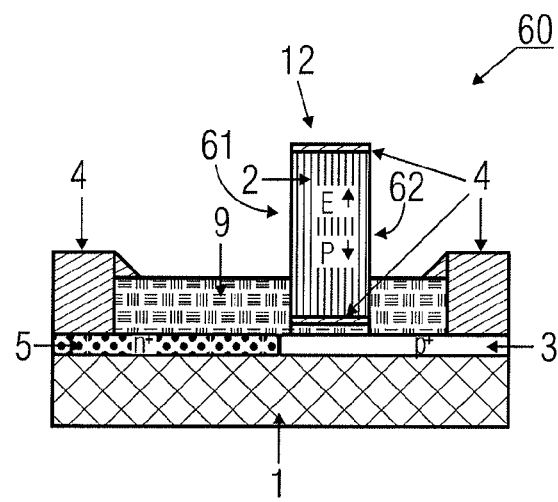
FIG. 6 shows a vertically implemented piezo-pn switch having a one-sided longitudinal piezo actuator according to an embodiment of the present invention.

With the hitherto described piezo-pn switches according to embodiments of the present invention, the second member or the piezoelectric actuator 12, respectively, is located laterally next to the pn structure of the first member 11. FIG. 6 shows an embodiment of an inventive piezo-pn switch 60 in a vertical design.

In the embodiment illustrated in FIG. 6, vertically across the p-doped area 3 of a pn structure 3, 5 exemplarily a longitudinal piezo actuator 12 is arranged which may deform the underlying crystal lattice of the semiconductor material of the pn structure 3, 5 in the direction of tension or pressure as a consequence of the control voltage applied to the electrically conductive contacts 4. The arrangement of the piezo actuator 12, as it is illustrated in FIG. 6, is merely exemplary. The piezo actuator 12 may also be applied such that it at least partially overlaps the n-doped area 5. I.e., in FIG. 6 the piezo actuator 12 might also be arranged further left vertically above the pn structure 3, 5. Likewise, the electrically conductive contacts 4 might also be arranged differently, i.e., for example, at lateral surfaces 61, 62 of the piezoelectric area 2. From this, for example a shear or transversal actuator, respectively, would result.

For an increase of the deformation degree of the crystal lattice of the pn structure 3, 5 of the first member 11, a modification of the previously described embodiments may be executed which may practically be regarded as piezo-pn switching elements. In this respect, FIG. 7 shows a further embodiment of a device 70 for switching an electric signal.

Figure 7:
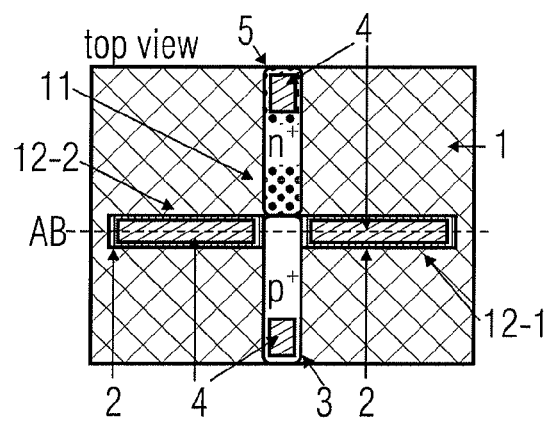
FIG. 7 shows piezo-pn switches having two piezo actuators according to an embodiment of the present invention.
Figure 8:
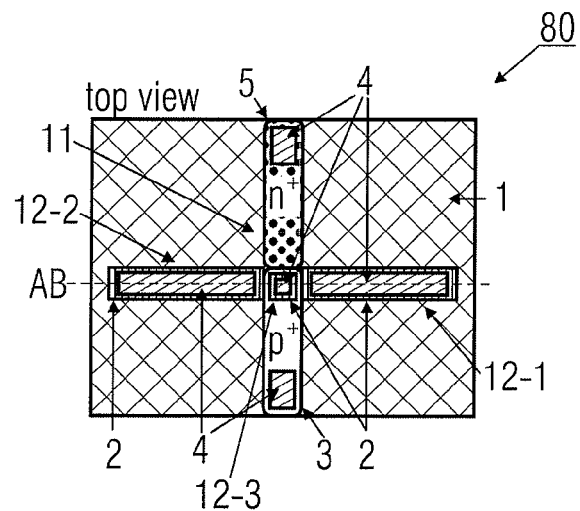
FIG. 8 shows piezo-pn switches having three piezo actuators according to an embodiment of the present invention.

FIG. 7 shows an embodiment of a piezo-pn switch having a further piezo actuator 12. The opposingly arranged piezo actuators 12-1, 12-2 in FIG. 7 may stress the crystal lattice of the semiconductor material of the pn structure 3, 5 lying in between in the direction of tension or pressure, depending on the polarity of the control voltage applied to the piezo actuators 12-1, 12-2. By an additionally applied vertical piezo actuator 12-3, the crystal lattice of the pn structure 3, 5 may be deformed in three locations, as it is illustrated schematically in the top view of FIG. 8. Here, the direction of the deformation (tension or compression, respectively) may be the same or different, e.g. pressure may be applied to the crystal lattice from the top and tension from the sides. For this purpose, piezoelectric longitudinal, transversal or shear actuators may be used, as they were already described above.

Figure 9:
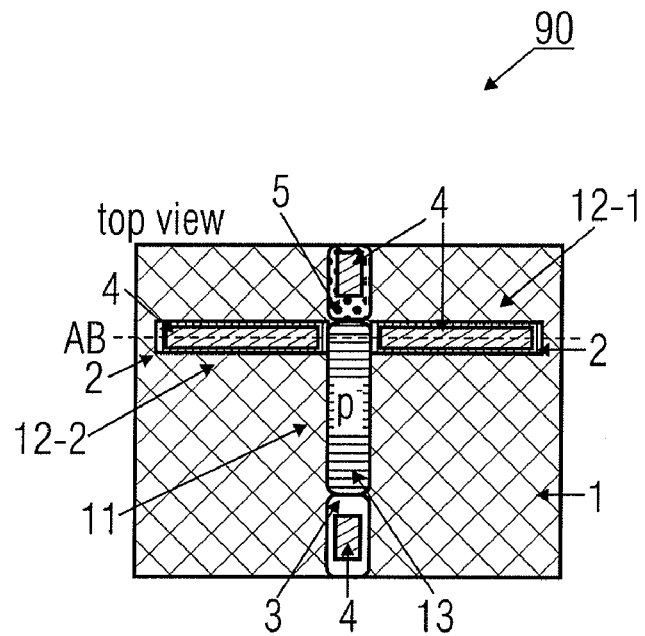
FIG. 9 shows piezo-pn switches having two piezo actuators and a pin structure according to an embodiment of the present invention.

FIG. 9 shows a further embodiment of a device 90 for switching an electric signal, wherein the doping of the pn transition of the pn structure 3, 5 is changed.

In the embodiment illustrated in FIG. 9, instead of a pn structure a so-called pin structure (positive-intrinsic-negative) is used. In contrast to the pn structure 3, 5 here the p-doped area 3 is not in a direct contact with the n-doped area 5, but a weakly doped or undoped i area 13 (i=intrinsic) is lying in between. In other words, the p-doped area comprises a first doping area 13 and a second doping area 3, wherein the first doping area comprises a lower doping concentration than the second doping area 3. The pin structure for example comprises a highly doped n area 5, a weakly doped p area 13 and a highly doped p area 3. According to embodiments, a piezo actuator 12 is coupled to the first doping area 13 of the p-doped area to cause the mechanical deformation of the first member 11 or the pin structure, respectively. In the embodiment illustrated in FIG. 9, two piezo actuators 12-1 and 12-2 are coupled to the weakly doped p area 13. As was already described above, the piezo actuators 12-1, 12-2 might also be located in another location of the pin structure 3, 13, 5.

Figure 10:
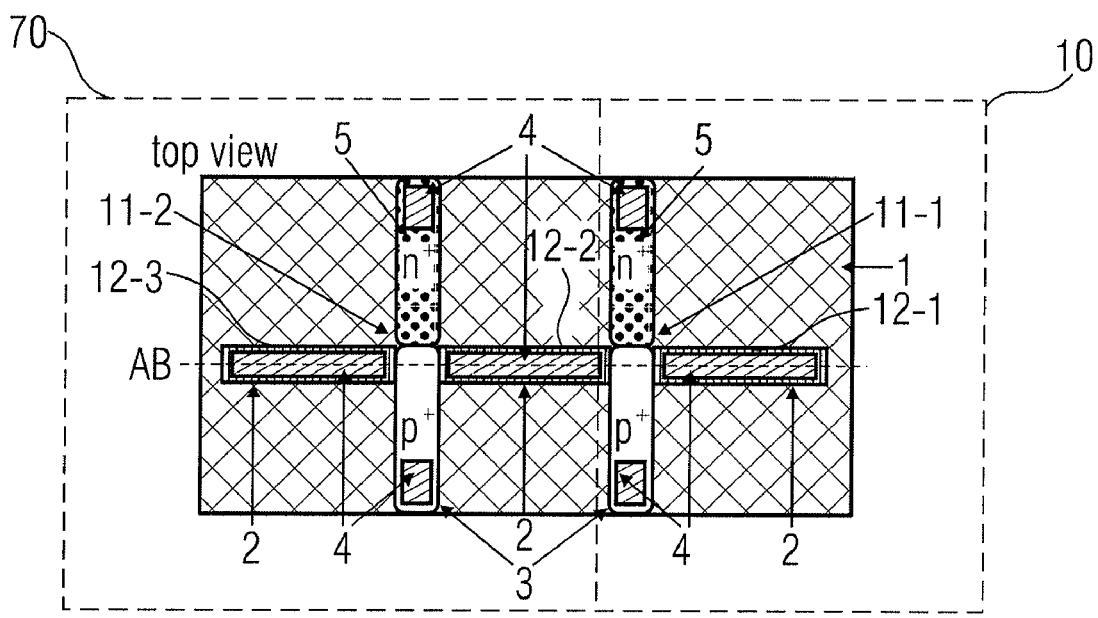
FIG. 10 shows a schematical illustration of a combination of two piezo-pn switches according to an embodiment of the present invention.

By a parallel arrangement of any number of single switches or piezo-pn switching elements, respectively, as they were described above, a mechanical work of the piezo actuators 12 may be tapped at both sides of a pn structure 3, 5 or a pin structure 3, 13, 5, respectively. In this respect, FIG. 10 shows a combination of one piezo-pn switching element each of FIG. 1 and FIG. 7.

By controlling the middle piezo actuator 12-2 it is possible to deform the crystal lattice of the pn structures 3, 5 of both members 11-1 and 11-2. Here, the individual members 11-1 and 11-2 may route same or different electric signals. If the members 11-1 and 11-2 arranged in parallel comprise different signals (voltages), an electric insulation between the two members 11-1 and 11-2 or their pn structures 3, 5, respectively, is advantageous. The electric insulation may, for example, be realized as a self-insulation, as is illustrated in FIG. 10, a dielectric insulation, e.g. by SOI (silicon on insulator), or by pn transitions.

Figure 11A:
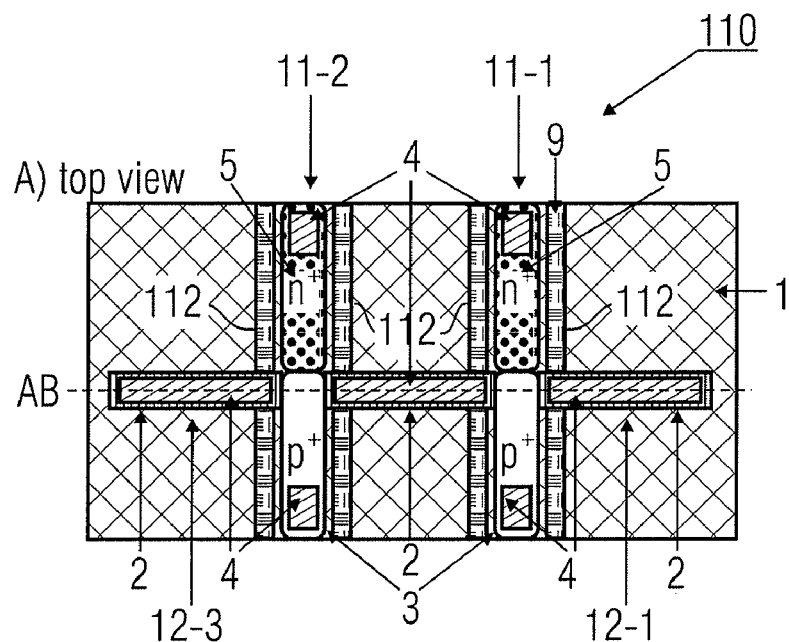
FIGS. 11a,b show a top view and a sectional view of a dielectric insulation of two piezo-pn switches according to an embodiment of the present invention.

One embodiment of a dielectric insulation of the two members 11-1, 11-2 is illustrated in FIGS. 11*a*, *b*.

Figure 11B:
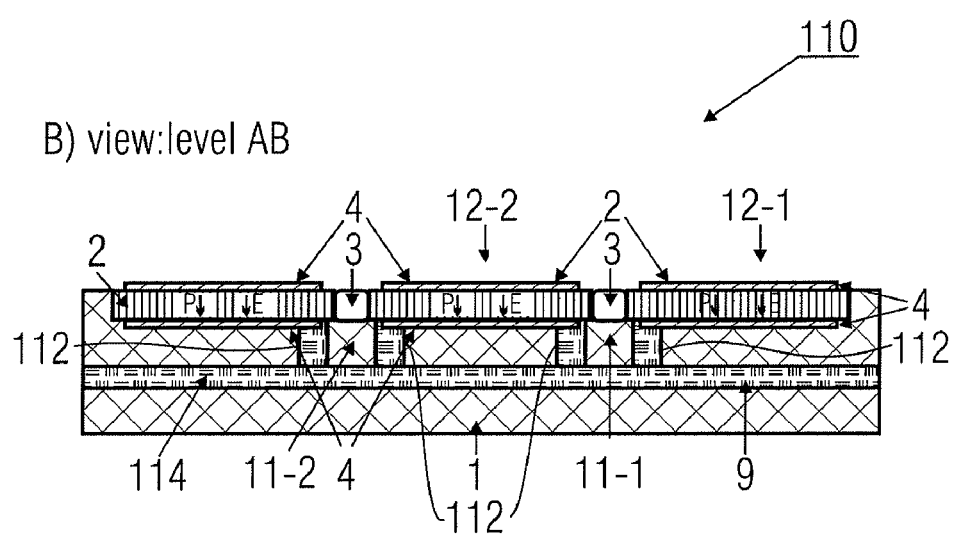

To electrically insulate the piezo-pn switches which are integrated together on a semiconductor substrate 1, insulation barriers 112 run laterally in parallel to the pn structures 3, 5 of the members 11-1, 11-2 in the semiconductor substrate 1, which run as illustrated in FIG. 11*b* through an insulation plane 114 in parallel to the bottom side of the integrated piezo-pn switch 110. By this, apart from the pn structures 3, 5 of the members 11-1, 11-2, at the same time also the electrically conductive contacts 4 applied to the bottom side of the piezoelectric areas 2 may be insulated against each other. It is clear that the insulation arrangement illustrated in FIGS. 11*a*, *b* is merely exemplary and that further arrangements for a dielectric insulation of the pn structures 3, 5 of the members 11-1, 11-2 are possible.

Figure 12A:
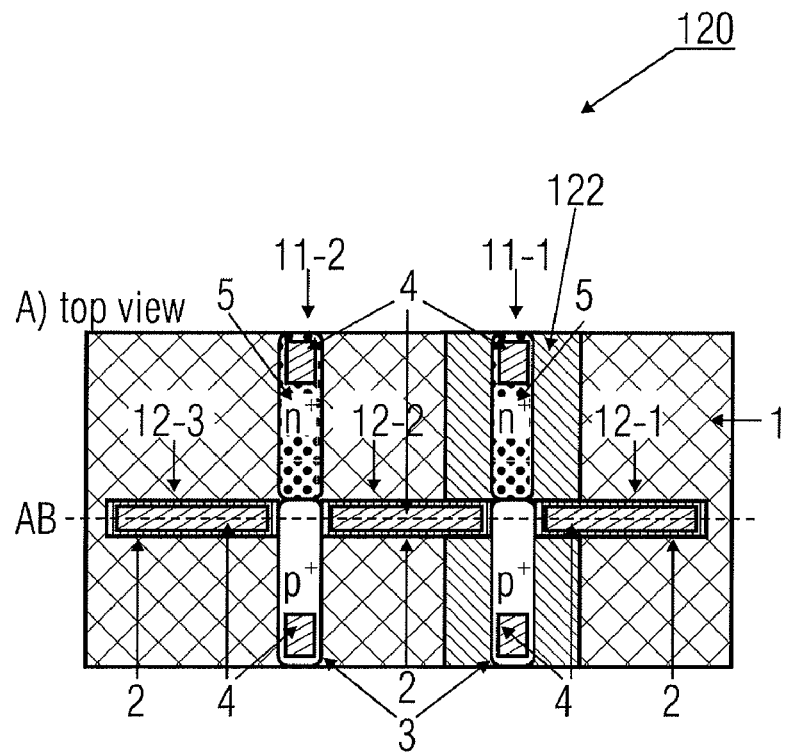
FIGS. 12a,b show a top view and a sectional view of an insulation by a pn transition according to an embodiment of the present invention.
Figure 12B:
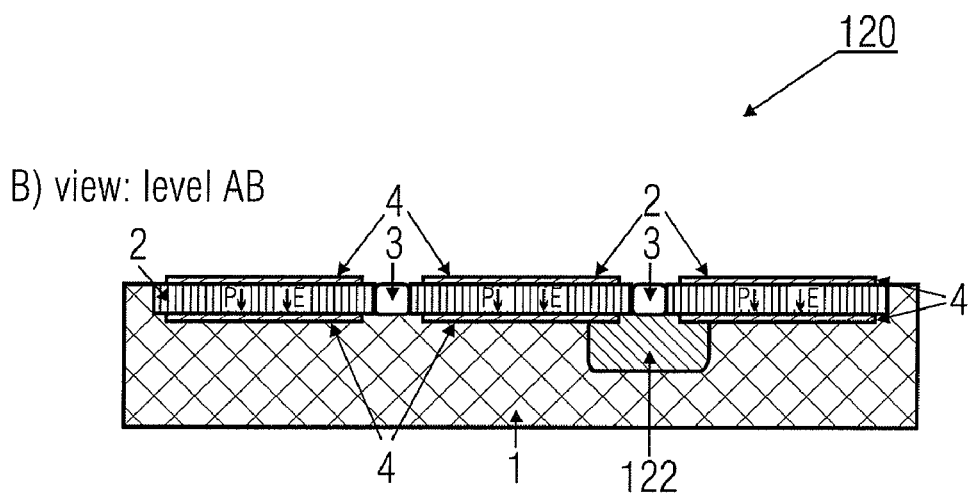

FIGS. 12*a*, *b* show different illustrations (top view, sectional view) of an integrated piezo-pn switch 120, wherein adjacent pn structures 3, 5 are insulated from the members 11-1, 11-2 by a pn transition operating in an off or non-conducting direction between the well 122 and the substrate 1.

With an insulation by pn transitions, pn structures 3, 5 of adjacent members 11-1, 11-2, which are pulsed with different voltages, may be placed in complementarily doped wells 122 in a doped semiconductor substrate 1. In the embodiments illustrated in FIGS. 12*a*, *b*, the well 122 may, for example, be an n-conducting well, while the semiconductor substrate 1 is p-conducting.

A pn insulation has the advantage compared to dielectric insulation that it is easier to realize. The necessitated pn transitions may easily be introduced together with the doping steps necessitated anyway for manufacturing the individual members by diffusion or implantation, while the dielectric insulation necessitates the introduction of trenches and their filling with insulation material, for example silicon dioxide and/or silicon nitride.

Figure 13:
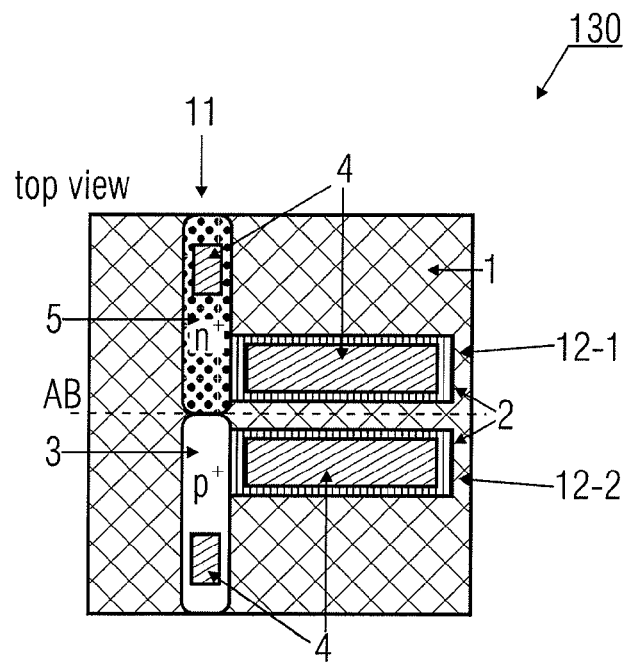
FIG. 13 shows a schematical top view of a switch having two separately controllable piezo actuators according to an embodiment of the present invention.

A further embodiment of a piezo-pn switch 130 according to embodiments of the present invention is illustrated in FIG. 13.

According to embodiments, both doping areas of the pn structure 3, 5 of the first member 11, i.e. both the p-doped area 3 and also the n-doped area 5, may be flanked by a piezo actuator 12-1, 12-2 each. An anti-parallel movement of the piezo actuators 12-1, 12-2 in the direction of tension or pressure, respectively, is either achieved by applying two control voltages of different polarities with the same direction of polarity of the piezoelectric material 2 or by a like-poled control voltage with an inverted polarity of the piezo material 2. If a parallel movement of the piezo actuators 12-1, 12-2 is desired, the two individual piezo actuators 12-1, 12-2 of FIG. 13 may be combined into one, as it is schematically illustrated in a top view of FIG. 14.

Figure 14:
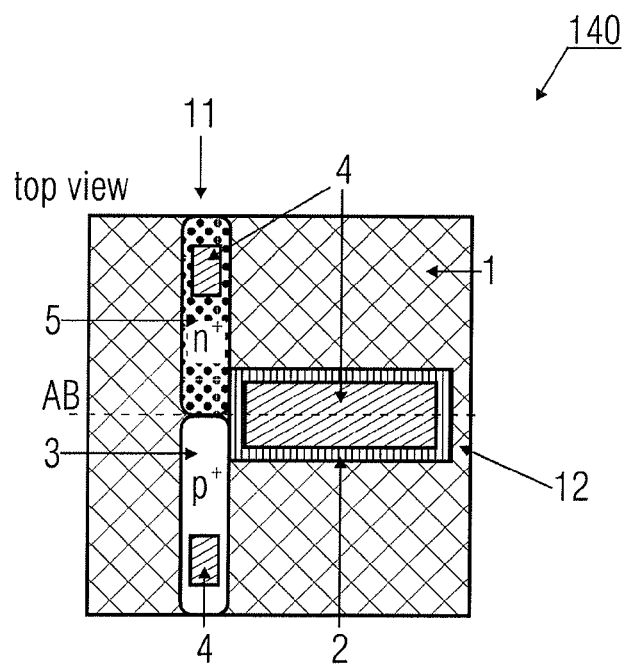
FIG. 14 shows a schematical top view of a switch having a controllable piezo actuator according to an embodiment of the present invention.

In FIG. 14, the piezo actuator 12 at the same time flanks both doping areas of the pn structure 3, 5 of the first member 11.

Figure 15A:
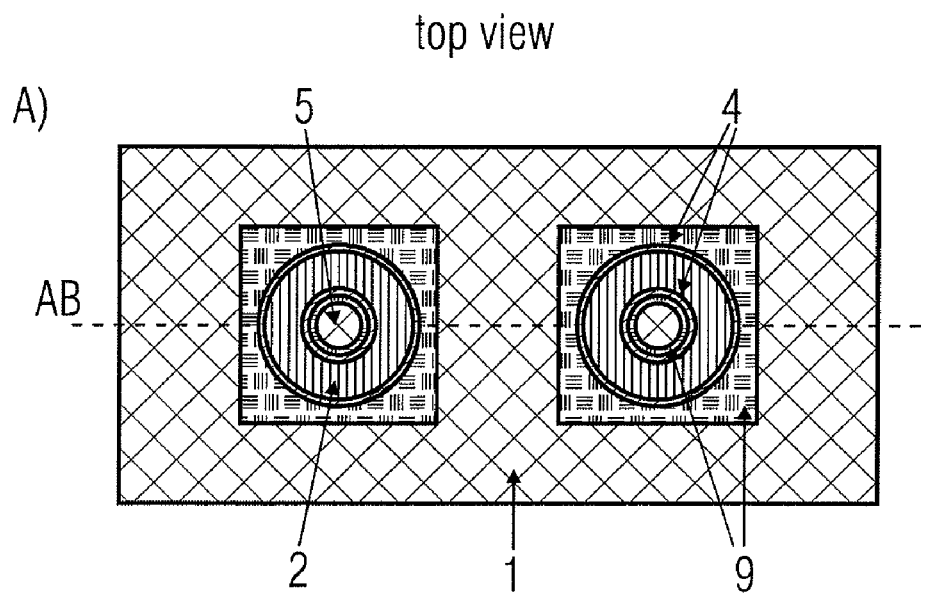
FIGS. 15a,b show a top view and a sectional view of a vertically arranged piezo-pn switch having an insulated, radial piezo actuator according to an embodiment of the present invention.

In different views, FIGS. 15a, b show a possible implementation of an inventive, vertical piezo-pn switch 150.

In the embodiment illustrated in FIGS. 15a, b, a strongly doped n-doped area 5 is arranged vertically above a weakly p-doped semiconductor substrate 1. Below the weakly p-doped area 1, a strongly p-doped area 3 is located, so that altogether a pin structure 3, 1, 5 results. The cylindrically designed strongly doped n-doped area 5 of this embodiment is radially provided with an insulation layer 9 on a cylindrical boundary layer to insulate the strongly n-doped area 5 with regard to a piezo actuator 12 arranged in a ring-shaped way around the n-doped area 5 having an inner electrically conductive contact 4-1 and an outer electrically conductive contact 4-2. Further, the insulation layer 9 is also arranged on the weakly p-doped semiconductor substrate 1, so that this weakly p-doped area 1 may be insulated against to the ring-shaped piezo actuator 12. The selected material dopings (n or p, respectively) are here only selected exemplarily and may also be exchanged.

Figure 15B:
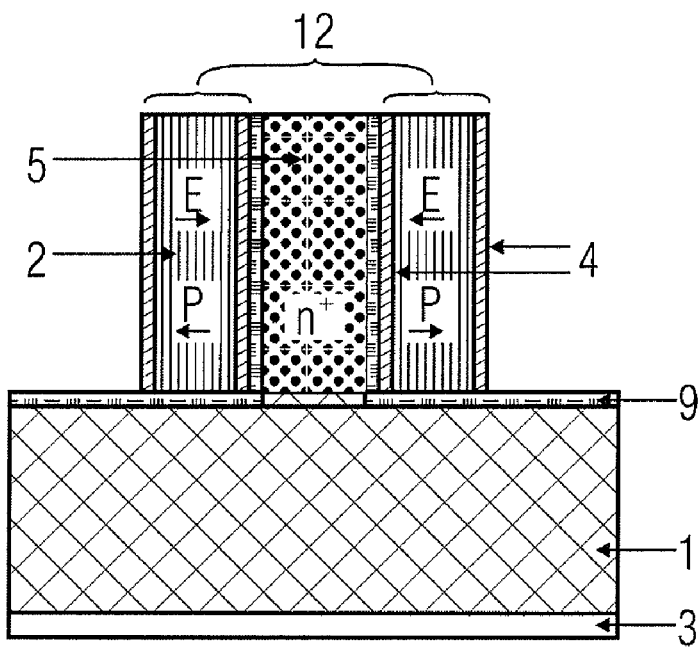

A mechanical deformation of the n-doped area 5 is executed in the embodiment illustrated in FIG. 15 via the radially polarized piezo tube 12, which is implemented around the n-doped area 5 of the pin structure 3, 1, 5. In case of an insulated variant according to FIGS. 15a, b, the piezoelectric actuator 12 may exert tension or pressure to the crystal lattice of the n-doped area 5. For a piezo actuator designed for tensile operation, it is possible to introduce a mechanical biasing of the piezo actuator by a nitride layer 42 with tensile stress, as it is schematically illustrated in FIG. 16.

The nitride layer 42 may in this respect be arranged outside the ring-shaped piezo actuator 12. In other words, the ring-shaped piezo actuator 12 may be imbedded into the nitride layer 42.

A non-insulated embodiment of a vertical piezo-pn switch 170 according to the present invention is illustrated in FIGS. 17a, b in a top view and a sectional view.

Compared to the insulated variant of FIGS. 15a, b, here the inner electrically conductive contact 4-1 and the insulation layer 9 around the n-doped area 5 are omitted. Here, the outer electrically conductive contact 4-2 and the highly doped n area 5 of the pin structure 3, 1, 5 serve as a control terminal. If only one unipolar control voltage U is available, the piezo actuator 12 of the piezo-pn switch 170 may only be operated in one direction, i.e. the mechanical deformation of the n-doped area 5 may only take place in one direction. In the case of a bipolar control voltage U, the piezo actuator 12 may be controlled into both directions, i.e. thus both pressure and also tension may be exerted to the crystal lattice of the n-doped area 5.

FIGS. 18a, b show a possible implementation of a device 180 for switching an electric signal according to the present invention.

The device 180 includes two elementary switches 182-1, 182-2, which are integrated on a common semiconductor substrate 1. The elementary switches 182-1, 182-2 each comprise radial piezo actuators which each surround a mesa-pn structure 3, 5. The mesa-pn structures 3, 5 are, for example, enclosed by an insulation material 9, for example $SiO_2$, in an insulated design of the switching device 180. Around this insulated mesa-pn structure a radially polarized piezo actuator system is located which includes an inner electrically conductive layer 4-1, a piezo layer 2 and an outer electrically conductive layer 4-2. The p and the n areas of the pn structures 3, 5 may each be coupled to a piezo actuator system individually or in pairs. FIG. 18a shows a pair-shaped embodiment in a top view. The pn structure of the switching element 182-1 is in this example additionally applied to a doped well 122 to be insulated against the second switching element 182-2 by a pn transition operating in an off direction between the well 122 and the substrate 1. The insulation may, however, also be implemented as a self-insulation or dielectric insulation.

Figure 19:
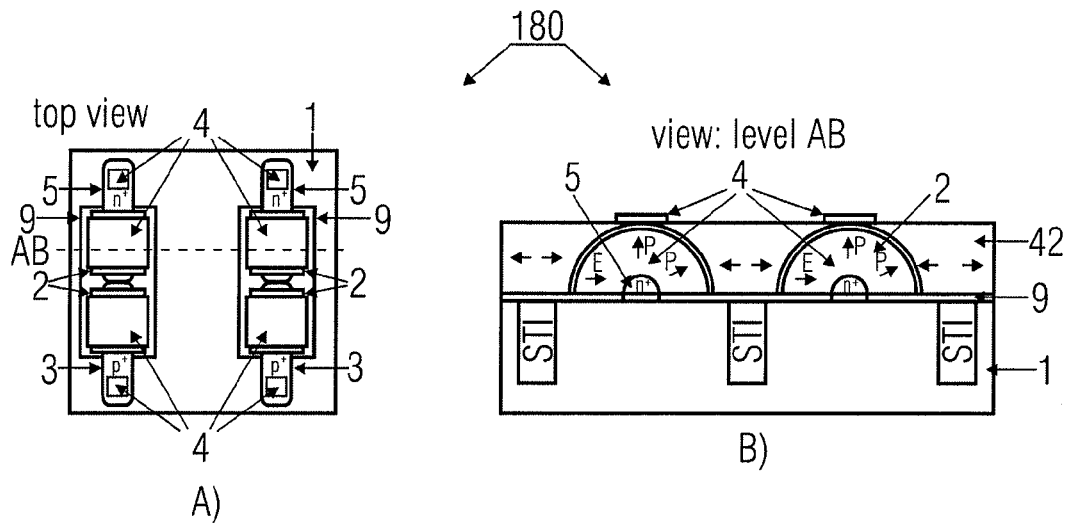
FIGS. 19a,b show a top view and a sectional view of a lateral piezo-pn switch having a non-insulated, radial piezo actuator according to an embodiment of the present invention.

For mechanically biasing the piezo actuators 12-1, 12-2, between the mesa structures of the switching elements 182-1, 182-2, a nitride 42 may be applied with tensile stress, as it is illustrated in FIG. 18b. Also a non-insulated design is possible. Compared to the above-described variant, here the insulation 9 and the inner electrically conductive layer 4-1 are omitted. Such a non-insulated embodiment of the present invention is illustrated in FIGS. 19a, b. Also here, only one mechanical deformation direction is possible with a unipolar control voltage.

Switching elements according to embodiments of the present invention may be implemented and used both as semiconductor switching devices in integrated circuits and also as discrete switches, in particular the vertical designs according to FIGS. 15 to 17. Also power devices similar to IGBTs (insulated gate bipolar transistor) may be realized by the inventive piezo-pn switch concept. One possible implementation, for example based on an IGBT trench technology, is illustrated in FIGS. 20a, b.

Figures 20A, 20B:
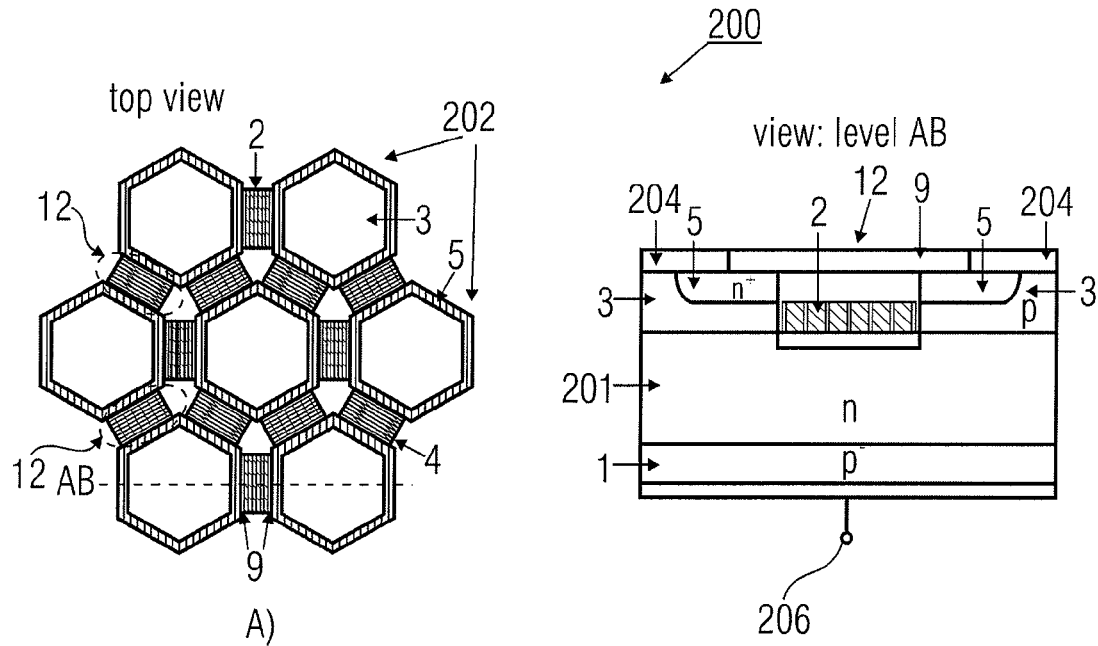
FIGS. 20a,b show a top view and a sectional view of a trench IGBT with a piezo-pn switch according to an embodiment of the present invention.

In sections, FIG. 20b shows a sectional view through a switch arrangement 200 according to an embodiment of the present invention which is similar to a vertical IGBT. The switch arrangement 200 includes a p-doped semiconductor substrate 1 which acts as an emitter area and is coupled to an anode contact 206. This emitter area 1 may be regarded as a collector. An n-doped drift area 201 is adjacent to the emitter area formed by the semiconductor substrate 1, which is doped complementarily to the emitter area 1. In the area of a front side of the switch 200 opposite to the back side, a cell field with a number of uniformly set-up cells 202 is located (FIG. 20a). Each of these cells 202 includes an n-doped source area 5 and a p-doped body area 3 arranged between the source area 5 and the drift area 201, wherein the body area 3 is doped complementarily to the source area 5 and the drift area 201.

For controlling a conductive channel or an inversion channel, respectively, in the body area 3 between the drift area 201 and the source area 5 a piezo actuator 12 is located which is arranged adjacent to the source area 5 and the body area 3 and insulated against the semiconductor body by an insulation layer 9. The body areas 3 are arranged spaced apart from each other in the drift area 201 and have, for example, a rectangular or hexagonal cross-section in a plane running perpendicular to the drawing plane illustrated in FIG. 20b, as it is exemplarily illustrated in FIG. 20a. The piezo actuators 12 are arranged in a grid-like way in this plane and comprise recesses, via which electrically conductive terminal contacts 204 contact the source areas 5 and the body areas 3 of the individual switch cells and thus short-circuit these areas 3, 5. The piezo actuator 12 is here insulated against this terminal contact 204 by means of a further insulation layer 9. I.e., around the hexagonal cathode area piezoelectric actuators 12 are introduced along the edges. Due to the honeycombed arrangement of the cathode cells, a piezo actuator 12 deforms two opposing crystal lattices of the body areas 3 which are p-doped in the illustrated embodiment. Complementary dopings are, of course, also possible.

The switch illustrated in FIGS. 20a, b conducts, if, for example, a positive voltage is applied between the emitter zone 1 and the terminal electrode 204, which is also designated as source electrode, and if a suitable control voltage is applied to the piezo actuator 12, which increases the charge carrier mobility in the body area 3.

FIGS. 21a to 21c show a piezo-pn switch 210 according to a further embodiment of the present invention in different views.

The illustrated switch 210 is further suitable for a bidirectional operation. The switch 210 comprises a substrate 1 of a first doping type in which, spaced apart from each other, two areas or wells 3, respectively, of a second doping type which is complementary to the first doping type are embedded. In the wells 3 of the second doping type according to one embodiment, again strongly doped areas or, respectively, islands 5 of the first doping type are introduced. The wells 3 and the islands 5 are each short-circuited by electrically conductive terminals 15, 14. Vertically above an area of the wells 3, each a piezoelectric area 2 is arranged, each of which is surrounded by two opposing control terminal electrodes 16, 18 and 17, 19 in order to form piezo actuators 12-1, 12-2. Parts of the terminals 15, 16 or 14, 17, respectively, are electrically insulated from each other by an insulation material 9. The two piezo actuators 12-1, 12-2 associated to the wells 3 of the second doping type each include a piezoelectric material 2 and control terminal electrodes 16, 18 and 17, 19. The control terminal electrodes 18, 19 are also insulated from each other by an insulation layer 9 on the doped semiconductor substrate 1.

As it is illustrated in FIG. 21c, embodiments of the present invention may additionally comprise piezo actuators 12-3, 12-4, which are coupled to the wells 3 and are integrated into the semiconductor substrate 1 basically perpendicularly, i.e. at an angle of 90°±20° to the vertically arranged piezo actuators 12-1, 12-2.

If the contact 14 in FIG. 21b acts as an anode and the contact 15 as a cathode, by applying a control voltage across the control terminal electrodes 16, 18 of the vertically arranged piezo actuators 12-1, 12-2, the piezo-pn switch 210 may be switched on. In the contrary case, where contact 14 acts as a cathode and contact 15 acts as an anode, the piezo-pn switch 210 may be switched on by applying a control voltage across the control terminal electrodes 17 and 19. The horizontally arranged piezo actuators 12-3, 12-4 may additionally amplify the mechanical deformation of an area of the wells 3.

By embodiments of the present invention, completely new, both monolithically integrable and also discretely realizable switching devices may be realized. The functional principle of these switching devices is based on the utilization of the characteristics of a pn transition in combination with the indirect piezoelectric effect. These piezo-pn switches do not depend on the direct influence of electric fields for forming an on or off inversion channel, respectively. By this, a simple control or drive, respectively, of bipolar semiconductor structures may be facilitated, i.e. high current densities may be achieved. Apart from that, the control terminal or the "gate" of such piezo-pn switches may be controlled in a completely dielectrically insulated way. This enables a further degree of freedom in the use of these piezo-pn switches, as they are decoupled from the "anode" and "cathode" potential of the switching device. I.e., switching devices according to embodiments of the present invention may be potential-technically decoupled and controlled in an uncomplicated way and yet enable high current densities in the case of passage due to their bipolarity. The switching mechanism is not based on the formation of an (inverted) channel area between the substrate and the gate oxide by applying a control voltage to the gate contact as with current MOSFETs, but on a mechanical deformation of the crystal lattice of the pn structure. Here, the pn structure may also be extended by at least one doped area, so that a pnp or npn structure, respectively, results. Likewise, the pn structure may be implemented doubly, i.e., for example, in a "thyristor-like" pnpn structure.

The deformation does not take place by a one-time introduction of materials (areas) with a greater or smaller lattice constant than the substrate, but by applying the indirect piezoelectric effect. Compared to the MOS/MIS technology, a pn structure offers the advantage that only one pn transition, compared to two in the MOS/MIS technology, is necessitated and both charge carrier types contribute to the current flow. By this, higher current densities may be realized. Depending on the application profile, a selection may be made between a highly off or blocking structure, e.g. a pin diode, or a simple pn structure. As piezoelectric materials are not electrically conductive, the piezo actuator may be directly applied to the pn structure. The structure of the piezo-pn switches offers a higher ESD protection compared to MOS/MIS structures, as it comprises no thin gate dielectrics. The dielectrically insulated control/drive of the pn structure via one or several piezo actuators enables a control voltage which is potential technically decoupled from the signal voltage. Further, the dielectrically insulated control offers the possibility of using bidirectional switches, in particular power switches, via piezo actuators. A switching speed of inventive piezo-pn switches is limited by a maximum power density of the piezo actuators. If, for example, an industrially available 0.18 μm CMOS technology according to the current standard is considered, clock frequencies of 10 MHz may be realized with problems. The same may further be increased by increasing the power densities or geometry variants of the piezo actuators.

Finally, it is to be noted that the present invention is not limited to the respective members of the switches or the explained procedures, as these members and methods may vary. The terms used here only serve for describing special embodiments and are not used in a limiting sense. If the singular or the indefinite article are used in the description and in the claims, the same also relate to the plural of those elements as long as the overall context does not indicate otherwise. The same holds true vice versa.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for switching an electric signal, comprising:
   coupling a first member comprising a p-doped area with a first terminal and an n-doped area with a second terminal to a second member with a piezoelectric area and with a terminal for a control signal;
   coupling an arrangement generating pressure or tension on the piezoelectric area to the piezoelectric area to mechanically bias the piezoelectric area;
   applying the control signal to the piezoelectric area to cause a mechanical deformation of the first member by the second member in an area of a transition from the p-doped area into the n-doped area.

2. The method according to claim 1, wherein the mechanical deformation of the first member is caused such that a mobility of electrical charge carriers in the first member changes, so that the first member may be set into an electrically on or off state.

3. The method according to claim 1, wherein in the second member a piezoelectric area is arranged comprising a terminal for a control signal, to cause the mechanical deformation of the first member by applying the control signal to the piezoelectric area.

4. A device for switching an electric signal, comprising:
a first member comprising a p-doped area with a first terminal and comprising an n-doped area with a second terminal, and
a second member coupled to the first member comprising a piezoelectric area and a terminal for a control signal, to cause, by applying the control signal to the piezoelectric area, a mechanical deformation of the first member in an area of a transition from the p-doped area into the n-doped area,
wherein the piezoelectric area is mechanically biased by coupling an arrangement generating pressure or tension onto the piezoelectric area to the piezoelectric area.

5. The device according to claim 4, wherein the second member is implemented to cause the mechanical deformation of the first member such that a mobility of electrical charge carriers in the first member changes, so that the first member may be set into an electrically on or off state.

6. The device according to claim 4, wherein the terminal for the control signal is formed by two electrically conductive contacts arranged at opposite sides of the piezoelectric area.

7. The device according to claim 6, wherein the mechanical deformation is caused by applying a control voltage to the two opposite electrically conductive contacts of the terminal for the control signal.

8. The device according to claim 7, wherein, by applying the control voltage between the electrically conductive contacts, an electric field with a field direction is formed which forms an angle of 90°±20° with a polarization direction of the piezoelectric area, so that, when applying the control signal to the second member, the transition from the p-doped area into the n-doped area is extended or compressed, depending on the polarization of the control signal, by a mechanical influence of the piezoelectric area.

9. The device according to claim 7, wherein, by applying the control voltage between the electrically conductive contacts, an electric field with a field direction is formed which forms an angle of 0°±20° or 180°±20° with a polarization direction of the piezoelectric area, so that, when applying the control signal to the second member, the transition from the p-doped area into the n-doped area is extended or compressed, depending on the polarization of the control signal, by a mechanical influence of the piezoelectric area.

10. The device according to claim 4, wherein the arrangement generating tension or pressure comprises a nitride compound.

11. The device according to claim 4, wherein the first terminal and the second terminal of the first member are wired up such that the transition from the p-doped area into the n-doped area is normally off.

12. The device according to claim 4, wherein the first terminal and the second terminal of the first member are wired up such that the transition from the p-doped area into the n-doped area is normally on.

13. The device according to claim 4, wherein the second member comprises a further piezoelectric area at one side of the transition from the p-doped area into the n-doped area which is opposite to the piezoelectric area, wherein the further piezoelectric area is coupled to the first member in an area of the transition from the p-doped area into the n-doped area in order to cause the mechanical deformation.

14. The device according to claim 4, wherein the p-doped area comprises a first doping area and a second doping area, wherein the first doping area comprises a smaller doping concentration than the second doping area.

15. The device according to claim 14, wherein the piezoelectric area of the second member is coupled to the first doping area to cause the mechanical deformation.

16. The device according to claim 4, wherein the first member and the second member are integrated on a common semiconductor substrate.

17. The device according to claim 16, wherein the first member and the second member are integrated laterally directly adjacent on the semiconductor substrate.

18. The device according to claim 16, wherein the first member and the second member are integrated laterally next to each other on the semiconductor substrate separated by an insulation layer.

19. The device according to claim 16, wherein the first member and the second member are integrated on the semiconductor substrate vertically directly on top of each other.

20. The device according to claim 16, wherein the first member and the second member are integrated on the semiconductor substrate vertically on top of each other separated by an insulation layer.

21. The device according to claim 4, wherein the first member and the second member are set up discretely.

* * * * *